United States Patent [19]

Nagasawa et al.

[11] Patent Number: 5,690,998
[45] Date of Patent: Nov. 25, 1997

[54] METHOD OF COATING A CONDUCTIVE PROBE NEEDLE

[75] Inventors: Yasushi Nagasawa, Yamanashi-Ken; Satoru Yamashita; Masahiko Matsudo, both of Kofu, all of Japan

[73] Assignees: Tokyo Electron Kabushiki kaisha, Tokyo-to; Tokyo Electron Yamanashi Kabushiki Kaisha, Yamanashi-ken, both of Japan

[21] Appl. No.: 622,854

[22] Filed: Mar. 29, 1996

Related U.S. Application Data

[62] Division of Ser. No. 227,638, Apr. 14, 1994, Pat. No. 5,532,613.

[30] Foreign Application Priority Data

Apr. 16, 1993 [JP] Japan .................. 5-113690
Apr. 27, 1993 [JP] Japan .................. 5-123335

[51] Int. Cl.⁶ .................. B05D 1/32; B05D 1/36
[52] U.S. Cl. .................. 427/255.6; 427/259; 427/282; 427/287
[58] Field of Search .................. 427/58, 272, 282, 427/156, 256, 255.6, 259, 287, 295, 385.5

[56] References Cited

U.S. PATENT DOCUMENTS

| | | | |
|---|---|---|---|
| 3,309,227 | 3/1967 | McTeague et al. | 427/255.6 |
| 3,806,801 | 4/1974 | Bove | 324/72.5 |
| 4,299,866 | 11/1981 | Clark et al. | 427/255.6 |
| 4,515,876 | 5/1985 | Yoshihara et al. | 430/5 |
| 4,850,359 | 7/1989 | Putz | 128/642 |
| 4,871,964 | 10/1989 | Boll et al. | 324/754 |
| 5,280,236 | 1/1994 | Takahashi et al. | 324/754 |
| 5,449,017 | 9/1995 | Collins et al. | 137/312 |

*Primary Examiner*—Shrive Beck
*Assistant Examiner*—Fred J. Parker
*Attorney, Agent, or Firm*—Beveridge, DeGrandi, Weilacher & Young, LLP

[57] ABSTRACT

The present invention relates to a probe needle wherein a conductive film is formed over a first insulating film formed around the outer periphery of a rod-like member through which a signal current flows, a second insulating film is formed over the outer periphery of the conductive film, and the conductive film is grounded. Since the rod-like member through which a signal current flows is thereby shielded, it is not affected by noise, and mutual crosstalk between signal currents is also prevented. Moreover, since ill effects caused by mutual contact with other probe needles is prevented by the second insulating film, reliable and stable measurement is possible. The coating of the probe needle is implemented by covering non-coating portions of the probe needle by a melted thermally liquefiable wax, hardening the thermally liquefiable wax covering the non-coating portions at room temperature, applying a coating to the probe needle by vacuum deposition, heating the thermally liquefiable wax once again, and then removing the thermally liquefiable wax from the probe needle. As a result, a probe needle is obtained wherein a non-coating portion is reliably delimited from a coating portion by a masking boundary. When the coating process is completed, the probe needle could be subjected to washing to completely remove any remaining wax.

14 Claims, 9 Drawing Sheets

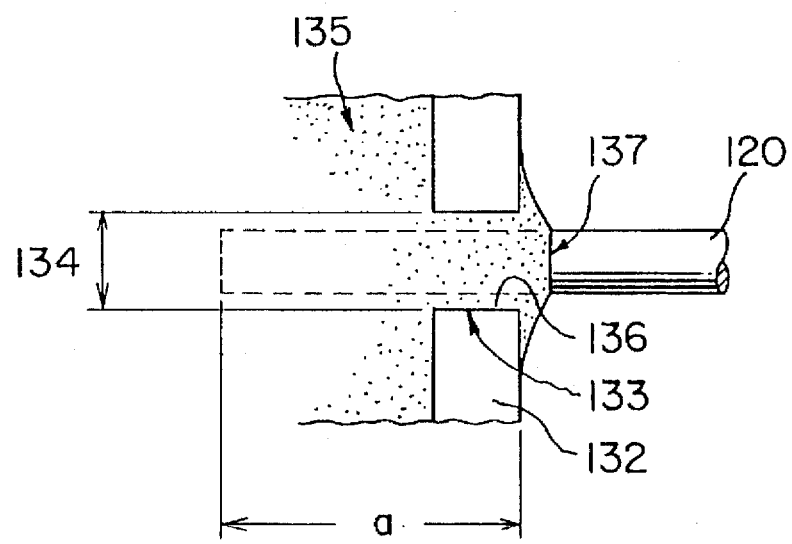
F I G. 7
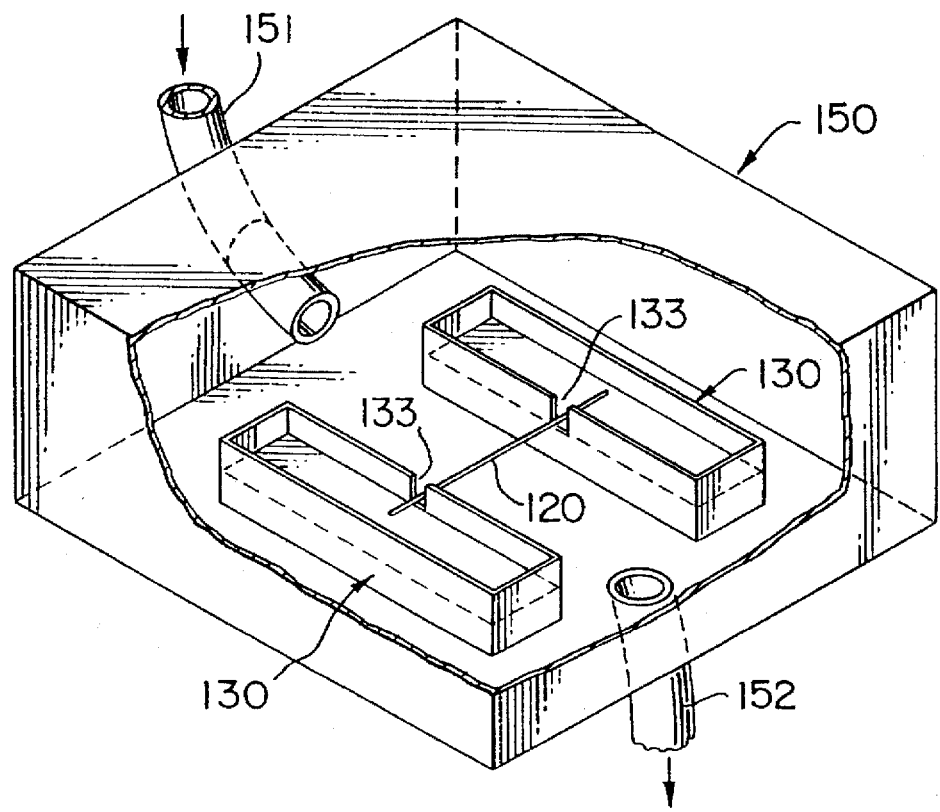
F I G. 8

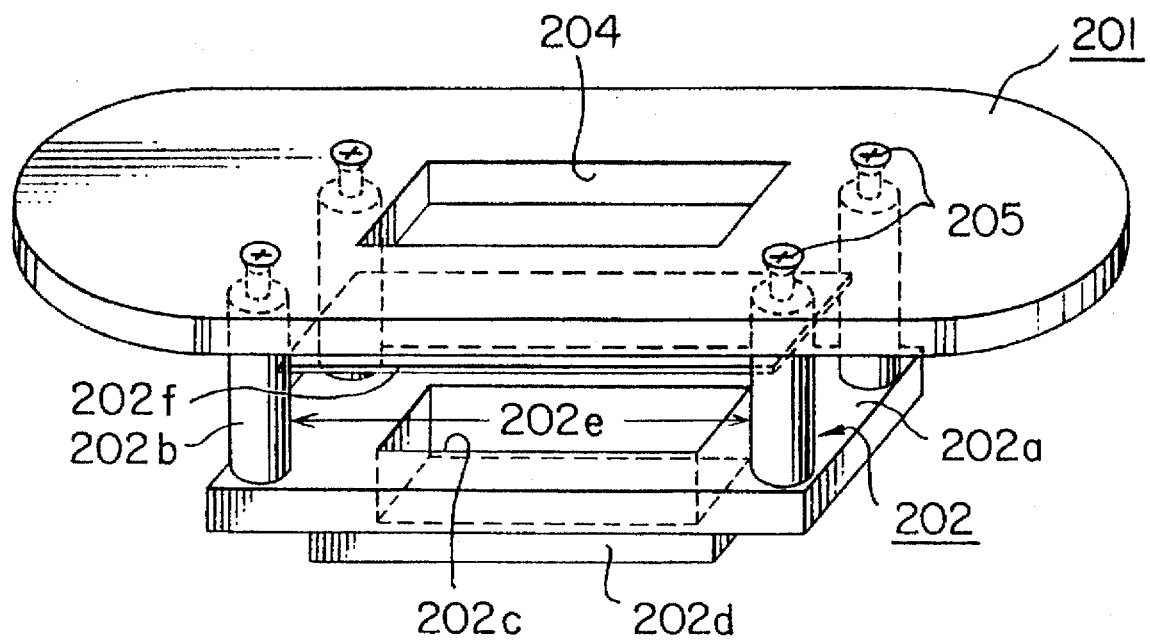
F I G. 13
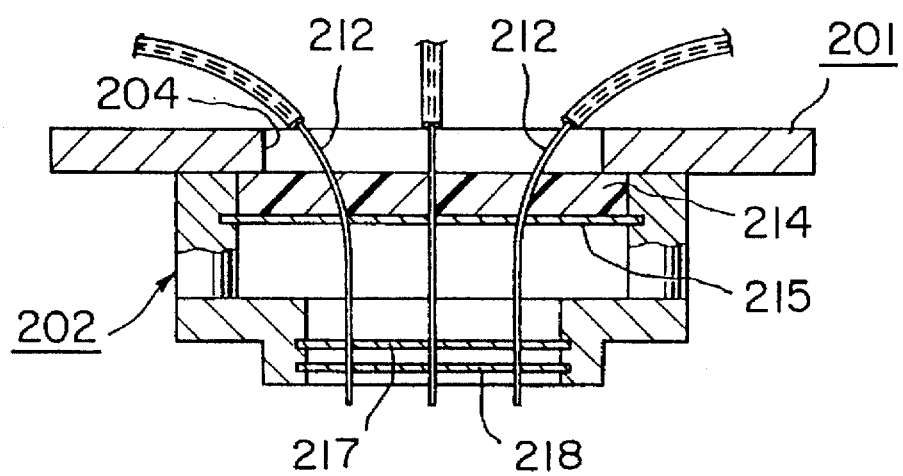
F I G. 14

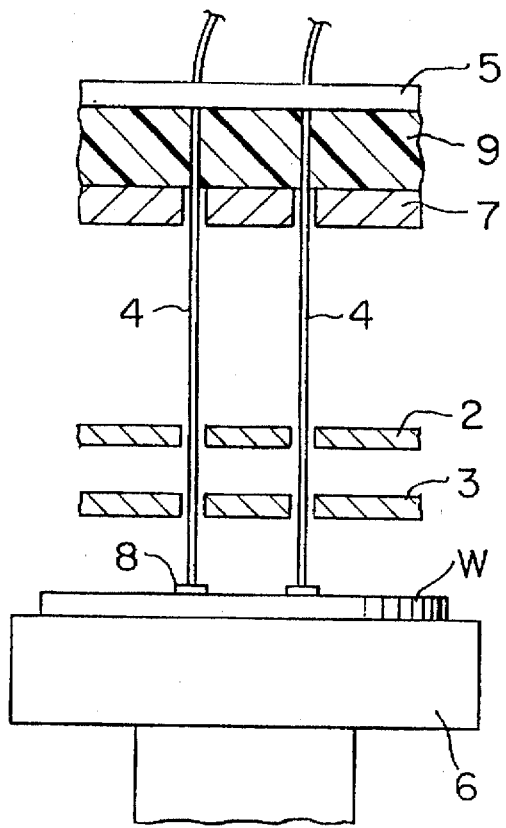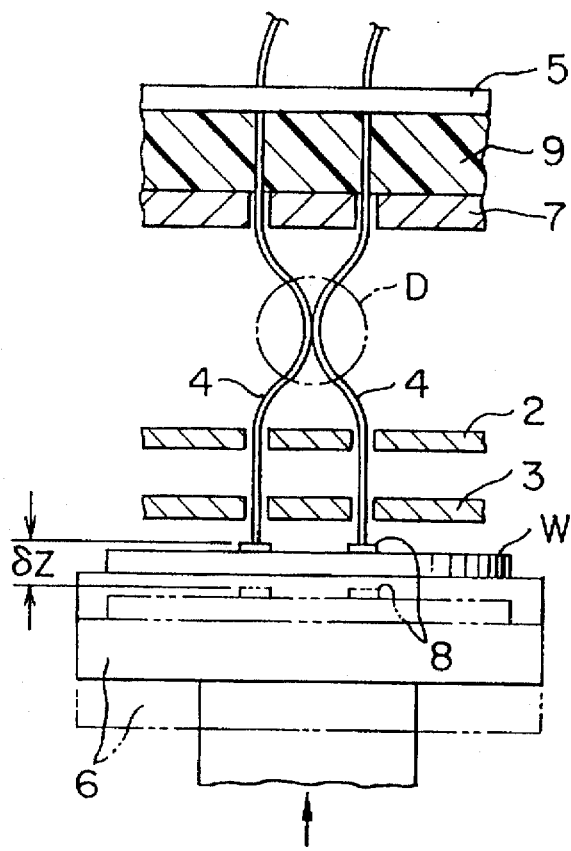
FIG. 15A
PRIOR ART
FIG. 15B
PRIOR ART

1

METHOD OF COATING A CONDUCTIVE PROBE NEEDLE

This is a divisional of application Ser. No. 08/227,638 filed on Apr. 14, 1994, now U.S. Pat. No. 5,532,613.

BACKGROUND OF THE INVENTION

The present invention relates to a probe needle, and a method of coating a probe needle.

Conventionally, following the fabrication of a semiconductor device element such as an LSI, IC chip or the like on a semiconductor wafer (hereinafter referred to simply as "wafer") that has been subjected to wafer processing, the quality of each chip is determined by performing tests of the electrical characteristics during a process that is called probe testing, using a test apparatus called a prober, in order to check for various faults such as short-circuits or open-circuits in the pattern, or the characteristics of the chips.

The wafer is subsequently separated into individual chips, the chips that have passed the above tests are packaged then subjected to further predetermined testing, and the final products are shipped after their quality has been determined.

During the checking of electrical characteristics by these probe tests while the wafer is still in wafer form, the wafer is mounted on a mounting stand, then measurement pads on the wafer are brought into electrical contact with, for example, probe needles or bumps made of tungsten (W) that are arranged in a probe card provided in the probe device. Further, a predetermined test signal is sent for each chip by bringing the above probe card into electrical connect with a test head via a contact ring, and the testing is implemented by monitoring the resultant responses.

However, prior art contactors are not provided with any particular countermeasures against noise, and thus when such prior art contactors are used for measuring an object under test that requires high-frequency testing, for example, a problem is encountered in that reliable measurement is prevented by noise and crosstalk between signal channels.

Recently, as semiconductor devices have become more densely integrated, the pitch of the measurement pads on each semiconductor chip has become tighter, and thus it is becoming necessary to arrange the tips of the probe needles used by the probe tests at a correspondingly tighter pitch.

In other words, when probe needles are arranged in a prior art probe card, they are arrayed in such as manner that adjacent probe needles in each group do not touch each other, and the groups of probe needles are fixed by epoxy resin in such a manner that they are held in position. However, there are limitations on the tightness of pitch possible with a configuration where groups of probe needles are not permitted to touch.

This problem will now be described in further detail with reference to a probe device using vertically aligned needles, as shown in FIG. 15A and FIG. 15B.

As shown in FIG. 15A, the probe device using vertical needles is provided with conductive probe needles 4 that are set up vertically between a fixed plate 7 and guide plates 2 and 3. The configuration of the probe needles 4 is such that upper ends thereof are fixed at predetermined positions on a printed circuit board 5, and also lower ends thereof are in electrical contact with measurement pads 8 on a semiconductor chip W that is mounted on a mounting stand 6. The probe needles 4 are also fixed between the fixed plate 7 and the printed circuit board 5 by means such as a plug of epoxy resin 9.

2

During the measurement, the intention is to ensure electrical conduction between the measurement pads 8 and the tips of the probe needles 4 by moving the mounting stand 6 through a very small distance δZ in the Z-axis direction, as shown in FIG. 15B. In this case, the parts of the probe needles 4 between the guide plate 2 and the fixed plate 7 deform slightly to absorb motion in the vertical direction. However, if the probe needles 4 are set at a tight pitch, it is possible that groups of adjacent probe needles 4 will touch each other, as shown at reference symbol D, causing short-circuits.

Note that FIG. 15A and FIG. 15B illustrate an example of vertically aligned probe needles, but the same problem can occur with horizontally aligned probe needles where the probe needles are arrayed horizontally, in that, if the tightness of pitch is increased, groups of adjacent probe needles could bend and touch each other, causing short-circuits.

Another problem concerns the way in which it is currently unavoidable to rely on manual work to insert the probe needles into the probe card. Thus it is possible that groups of adjacent probe needles will touch and cause short-circuits during the fabrication and assembly, and so countermeasures are required.

For the above described reasons, there is a strong demand for covering the entire probe needle, except for parts such as the tip thereof, with an electrically insulating film or a protective film. Thus, various techniques have been proposed for providing an insulating coating over the probe needle, such as by placing an insulating sleeve over the probe needle, or painting an insulating agent thereover, and by further forming a thin, pinhole-free, uniform film of a material such as poly-para-xylene thereover by vacuum deposition.

Of these various coating techniques, methods of forming coatings of insulating or conductive films by vacuum deposition that have been developed by the present inventors are attracting attention because of the simplicity of such processing and the high quality of the finished product. However, when coating is done by such vacuum deposition, there still remains a problem concerning how to mask portions where coating is not required (non-coating portions), such as the tips of the needles.

Methods using masking tape or a masking rubber that has a volatile fixative have been considered as methods of masking the non-coating portions. However, each of these methods results in problems such as deformation of the extremely fine probe needles by adhesives or by hardening contraction, and accurate masking boundaries cannot be obtained because of spreading of the masking agent.

SUMMARY OF THE INVENTION

The present invention was devised in consideration of the above described problems, and has as a first objective thereof the intention of solving the above described problems by providing probe needles that enable reliable measurement while excluding the effects of noise and crosstalk between signal channels.

The present invention was also devised in consideration of the above described technical challenges. Therefore, another objective thereof is to provide a new and improved method of coating probe needles that enables a coating that does not damage the extremely fine probe needles, that makes it possible to accurately define masking boundaries, and that can also be applied to vacuum deposition processing.

Thus the present invention is characterized in providing a probe needle used in a prober that tests semiconductor elements, wherein the probe needle has conductive characteristics such that it can be placed in contact with a contact portion of a semiconductor element to enable electrical contact therewith; wherein a first insulating film is provided over the entire outer periphery of the conductive probe needle except for at least a contact portion thereof, a conductive film is provided over the outer periphery of the first insulating film, and then a second insulating film is provided over the conductive film; and wherein the conductive film is grounded.

The probe needle could be formed of a conductive polymer. Suitable examples of such conductive polymers could be polymers that have conjugate double bonds as principle chains, such as polyacetylene, polyphenylene, polypyrrole, polythiophene, polyquinoline, or polypyridine.

With the present invention, since the probe needles themselves are conductive, a conductive film is formed over the outer periphery thereof with a first insulating film therebetween, and this conductive film is grounded, the conductive film has a shielding function and thus noise and crosstalk between signal channels is shut out by this conductive film. In addition, the signal current flowing through the main body of each probe needle is not affected by this noise and crosstalk between signal channels. Therefore reliable measurements are provided, even if noise should occur, and crosstalk between signal channels is prevented.

Further, since a second insulating film is provided over the outer periphery of the conductive film, if the probe needle should flex or bend during measurements, for example, there is no ill effect, even if the probe needle should come into contact with other probe needles. Since the conductive film itself is grounded, it is considered that there will normally be no effect on the signal current flowing through the probe needle itself, even if it should come into contact with the conductive film of another probe needle. However, the signal currents that flow through such a probe needle are extremely weak, so that it is impossible to ignore the effects of even a slight change in the impedance if conductive films come into mutual contact.

To prevent this effect, the present invention further provides a second insulating film over the outer periphery of the conductive film, to counteract this change in impedance.

The present invention uses a conductive polymer as the material of the main body of the probe needle, but such a conductive polymer is subject to very little change in conductivity with respect to temperature changes. As a result, the probe needle in accordance with the present invention solves the problem seen in a prior art probe needle made of tungsten (W), where resistance varies widely as temperature increases, and thus it becomes difficult to provide reliable measurement.

A conductive polymer is lighter than the tungsten used in the prior art and also has satisfactory elasticity, so that it can smoothly follow even changes in the contact pressure with respect to the contact portion of the semiconductor element, the lifetime of the probe needle is increased, and an extremely stable contact status can be maintained.

To solve the above described problems, the present invention provides a method of coating a probe needle that is characterized in that non-coating portions of the probe needle are covered with a melted thermally liquefiable wax, the thermally liquefiable wax covering the non-coating portions is hardened at room temperature, the entire probe needle is subjected to coating by vacuum deposition, the thermally liquefiable wax is once again heated to melt, and the thermally liquefiable wax is then removed from the probe needle.

In accordance with the coating method of the present invention, portions that are desired to be maintained in an electrically conductive state are covered with melted thermally liquefiable wax, and the wax portions are hardened at room temperature. During this time, a highly accurate masking boundary is formed between the coating portion and the non-coating portion, due to the surface tension of the wax. An insulating film of a material such as poly-para-xylene or a conductive film of a material such as 18-karat gold is then formed over the surface of the probe needle by vacuum deposition in a predetermined chamber. During this time, there is a tight seal between the wax and the non-coating portion of the probe needle, so that the poly-para-xylene or gold particles cannot infiltrate therebetween and be deposited on the non-coating portion. After the coating process is completed, the thermally liquefiable wax is again heated, the thin film at the masking boundary is broken simply by removing the probe needle from a melting tank, and thus a probe needle with a coating over predetermined portions is provided.

BRIEF DESCRIPTION OF THE DRAWINGS

FIG. 7 is a partial, enlarged cross-sectional view showing the relationship (a waxing boundary portion) between wax and the non-coating portion of the probe needle, during the implementation of the method of coating an insulating film over a probe needle shown in FIG. 6.

FIG. 8 is a partially cutaway perspective view of a vacuum deposition device using the coating method of the present invention.

FIG. 13 is a perspective view of the inner guide portion of the probe card shown in FIG. 12, after assembly.

FIG. 14 is a cross-sectional view of the inner guide portion of the probe card shown in FIG. 12, in use.

FIG. 15A and FIG. 15B are views illustrative of prior art probe needle which are not provided with insulating coatings, in use.

DETAILED DESCRIPTION OF THE PREFERRED EMBODIMENTS

[First Embodiment]

Figure 1:
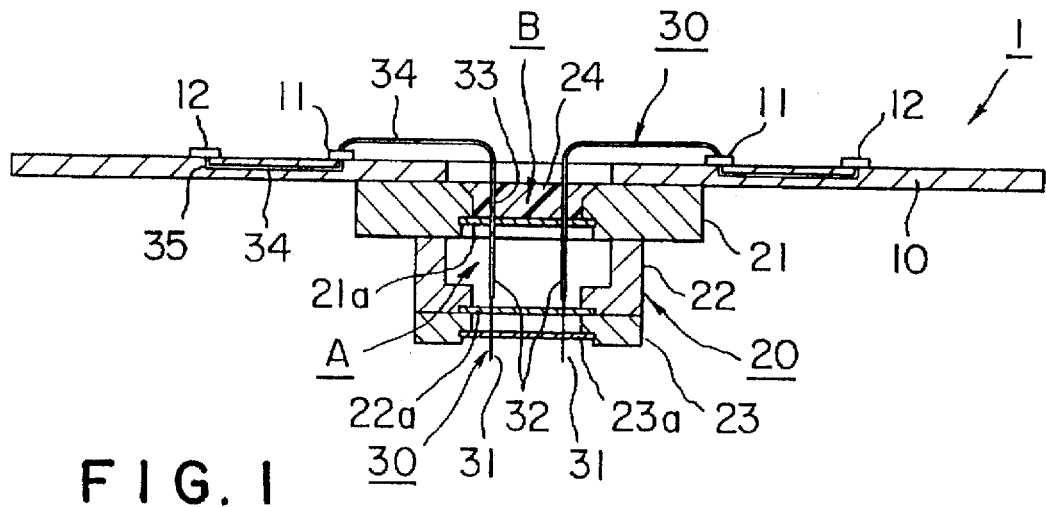
FIG. 1 is a cross-sectional view through a probe card that uses probe needles in accordance with a first embodiment of the present invention.

A first embodiment of the present invention will be described below with reference to FIG. 1 to FIG. 4. FIG. 1 is a side view of a probe card 1 that is the main structural component of a prober. This probe card 1 is configured of a substantially circular printed circuit board 10 and a guide member 20 provided pointing vertically downward from a central portion of the printed circuit board 10, as well as a plurality of vertically aligned probe needles 30 (of approximately 70 μm in diameter) of a rod-like shape that are held and guided by the guide member 20.

The guide member 20 is configured of, in sequence from the top, an upper block 21, an intermediate block 22, and a lower block 23, each having an insertion aperture in the center thereof. When the upper block 21, intermediate block 22, and then the lower block 23 are to be fixed together, they could be compressively fixed by means such as bolts, or they could be mutually affixed by a suitable adhesive.

A fixed plate 21a through which the probe needles 30 penetrate is provided in a lower portion of the aperture formed in the center of the upper block 21, an upper guide plate 22a having guide holes through which the probe needles 30 freely penetrate in a frictional manner is provided in a lower portion of the aperture of the intermediate block 22, and a lower guide plate 23a having guide holes through which the probe needles 30 freely penetrate in a frictional manner is provided in a lower portion of the aperture of the lower block 23, all three of these plates being arranged horizontally in a vertical stack parallel to one another.

The rod-shaped probe needles 30 are fixed in a resin member 24 that fills a space formed by the fixed plate 21a and the aperture of the upper block 21, and the probe needles 30 also pass through the respective guide holes in the upper guide plate 22a and the lower guide plate 23a, so that tip portions 31 thereof that form contact portions protrude downward from the lower guide plate 23a.

Intermediate portions 32 of the probe needles 30 are positioned in a space A formed between the upper guide plate 22a and the lower guide plate 23a, and the portions of the probe needles 30 from the intermediate portions 32 upward act as holder portions 33 that are positioned in a space B formed by the aperture in the upper block 21 and the fixed plate 21a. The resin for the resin member 24 (used for fixing, as described above) is then poured into this space B and hardened, so that the holder portions 33 of the probe needles 30 are fixed with respect to the guide member 20.

Portions of the probe needles 30 that continue upward from the holder portions 33 are configured as curved portions 34 that is embedded on top of the printed circuit board 10 and substantially parallel to the printed circuit board 10, and are temporarily embedded in the printed circuit board 10 at points 11 of the printed circuit board 10. The other end 35 (See FIG. 2) of the probe needles 30 are connected and fixed to contactor lands 12 with tip portions corresponding to the printed circuit board 10, such as freely extensible POGO-Pins that are provided on the main body of the prober.

Figure 2:
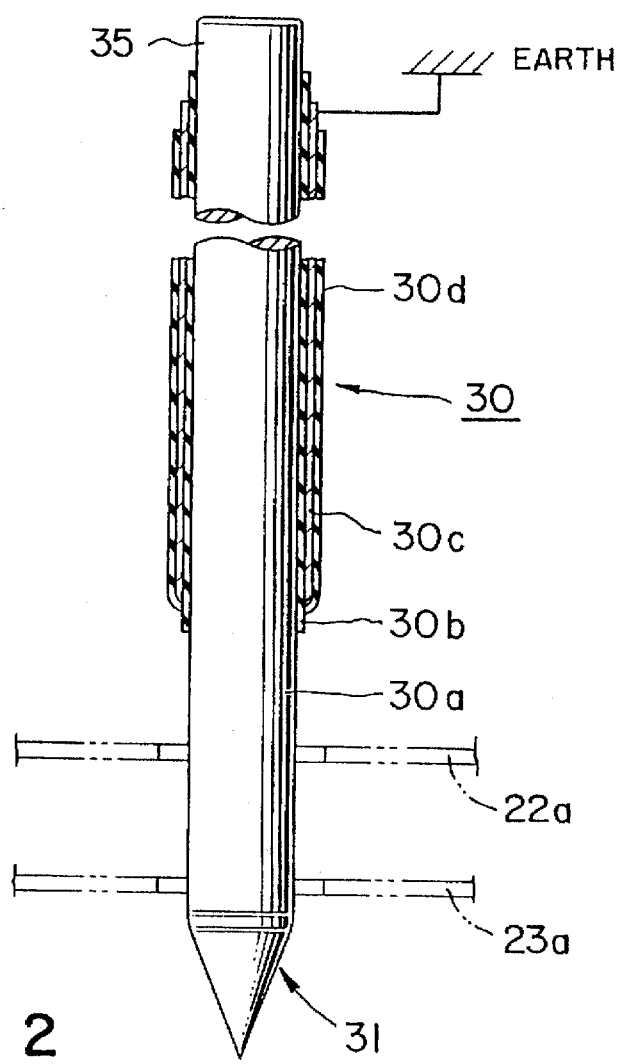
FIG. 2 is an enlarged cross-sectional view of a probe needle in accordance with the first embodiment of the present invention.

Each of the probe needles 30 has the configuration shown in FIG. 2. FIG. 2 is an enlarged cross-sectional view of the vicinity of the tip portion 31 of the probe needle 30, wherein poly-para-xylene (hereinafter abbreviated to "parylene") is used in a rod-like member 30a that forms a main body thereof. The maximum conductivity of this parylene is $4 \times 10^5$ [S/cm], giving it a conductivity close to that of silver or copper.

The outer periphery of the rod-like member 30a, except for a contact portion near the tip thereof that will come into contact with the object under test, is covered by a first insulating film 30b (approximately 5 μm thick) of parylene. To cover the outer periphery of the rod-like member 30a with a thin insulating film of parylene, except for the contact portion, the surface of the contact portion can be waxed with a suitable wax material, for example, and then parylene, for example, can be deposited by vacuum deposition over the entire rod-like member 30a, to form a thin, uniform insulating film. The waxed portion could then be removed (details will be given below with respect to a second embodiment).

The outer periphery of the first insulating film 30b is then covered with a conductive film 30c. The conductive film 30c of this first embodiment is configured of a thin film of gold (Au). To apply a thin conductive film of this type, a method such as sputtering or vacuum deposition could be used to form a thin, uniform conductive film.

In this first embodiment, gold is used as the material of the conductive film 30c, but it should be obvious to those skilled in the art that the conductive film 30c is not limited thereto; the conductive film 30c can be configured of any suitably conductive material such as a thin metal film.

The outer periphery of the conductive film 30c is further covered with a second insulating film 30d. The second insulating film 30d has a structure whereby parylene is applied by vacuum deposition, in the same manner as the first insulating film 30b.

Note that, in this first embodiment, the first insulating film 30b and the second insulating film 30d are formed of the same material, but it should be obvious that they could also be formed of mutually different materials.

The conductive film 30c is connected to a ground line that is part of the printed circuitry of the printed circuit board 10, at the location of a point 11 of the printed circuit board 10.

On the other hand, the rod-like member 30a of the probe needle 30, through which a signal current will flow, is connected and fixed to one of the previously described contact lands 12.

Figure 3:
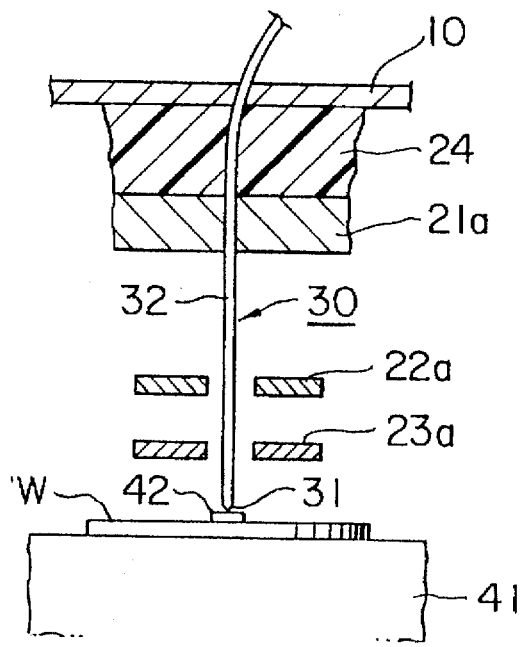
FIG. 3 is a cross-sectional view showing a wafer (which is the object under test) being tested by the probe needle shown in FIG. 2.

The testing of a wafer by a prober using this first embodiment of the present invention will now be described with reference to FIG. 3. In this case, a wafer W that is the object under test is mounted and held on a mounting stand 41 positioned underneath the probe card 1.

The mounting stand 41 is configured to hold the wafer W relatively in such a manner that it faces the group of tip portions 31 of the probe needles 30. The stand is also finely driven by a forward-backward drive control device so that it is controlled to move in the vertical direction (the Z-axis direction) and also in horizontal directions (linear movement in the X-axis direction and Y-axis direction, and rotational movement about a θ axis), with respect to probe needles 30 that are to correspond with electrode pads 42 provided on the supported wafer W.

The mounting stand 41 is first moved in the Z-axis direction by the forward-backward drive control device, in other words it is moved upward in the direction orthogonal to the mounting stand, to bring the aluminum electrode pads 42 on the wafer W into contact with the tip portions 31 of the probe needles 30. Subsequently, the mounting stand 41 is overdriven in the same upward direction, by about 50 μm, for instance, so that any variation in the tip portions 31 of the probe needles 30 can be absorbed.

During this time, since the rod-like members 30a of the probe needles 30 are formed of parylene, as described above, the probe needles 30 bend effortlessly and as appropriate within the intermediate portions 35, to follow any distortion in the contact pressure concomitant with the overdriving, to enable a stable and also optimal contact status.

From this status, the mounting stand 41 is subjected to fine linear control drive in the X-axis direction and Y-axis direction by the forward-backward drive control device, so that the tip portions 31 of the probe needles 30 scratch off and remove the oxide layer formed on the surfaces of the electrode pads 42 to provide reliable conduction between the electrode pads 42 and the tip portions 31 of the probe needles 30.

If suitable signal currents are now passed through the rod-like members 30a, the various characteristics of each chip formed on the wafer W can be reliably measured and tested.

In this case, since the outer periphery of each rod-like member 30a is covered with the grounded conductive film 30c, with the first insulating film 30b therebetween, the effects of noise and crosstalk between the signal currents flowing through the other probe needles are removed by the conductive film 30c. Therefore, reliable measurement and testing can be implemented, even with high-frequency measurements, for example.

In this first embodiment, the outer periphery of the conductive film 30c is further covered by the second insulating film 30d, as shown in FIG. 2. Thus, when the probe needles are overdriven as described above, a stable shielding effect is obtained without affecting the impedance of the conductive film 30c itself, even if the intermediate portion 32 of one probe needle 30 should come into contact with the intermediate portion 32 of another probe needle 30. This means that extremely reliable and stable measurements and testing can be implemented.

Further with this first embodiment, since the conductive polymer parylene is used as the material of the rod-like members 30a through which the currents flow, there will be virtually no deterioration in the conductivity thereof, even if the ambient temperature of the probe needles 30 should rise. This also helps to provide extremely reliable and stable measurement and testing.

When a conductive polymer is used as the material of the rod-like members 30a, as in this first embodiment, there is no deterioration in the conductivity thereof even if the temperature should rise. Therefore, if the probe tests are performed in an environment where it is unlikely that malfunctions such as noise or crosstalk can occur, there would be no particular need for an insulating film or grounding conductive film, as described above, and so the probe needle itself could be formed of a conductive polymer such as parylene. In such a case, a contactor that is stable and can continue to measure with respect to changes in temperature can be provided. Further, the shape of the contactor need not necessarily be that of the vertically aligned probe needle described above.

Figure 4:
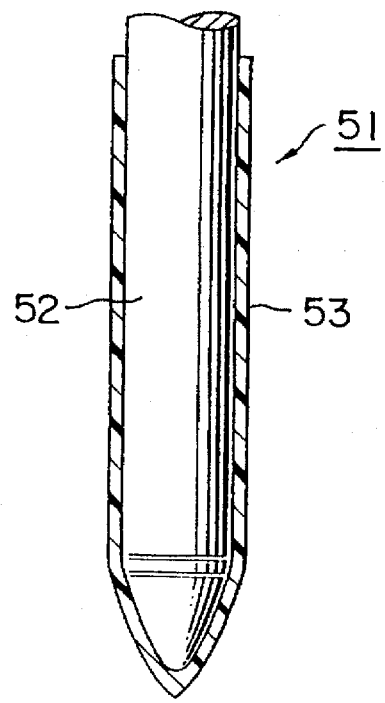
FIG. 4 is a partial enlarged cross-sectional view of a variation of the rod-like member that forms the probe needle shown in FIG. 2.

Note that, although the conductive polymer parylene is used as the material for rod-like member 30a of the above described first embodiment, the configuration could be such that a rod-like member 51 is used, as shown in FIG. 4, with an outer periphery thereof covered with a first insulating film, a conductive film, and a second insulating film, as described previously. This rod-like member 51 uses a core member 52 of Inconel (a Ni—Cr alloy), with a thin coating of gold over the outer periphery of the core member If a rod-like member 51 of this configuration is used as the main portion of a probe needle in accordance with the present invention, the shielding effect will be the same as that of the above embodiment, but, since the resistance of the portion through which the signal currents flow is extremely low, matching with the shield effect can be provided and thus extremely good measurements and checking can be implemented.

Moreover, if the Inconel used in the core member 52 is compared with the tungsten that is usually used for such probe needles, a ratio of the actual values for these types of material is in the order of 1/3, so that the present invention has the advantage of suppressing fabrication costs.

Considering the effects of the rod-like member 51 of the above described structure, if there is no particular need for the insulating film or the grounded conductive film, the probe needle itself can be configured of the rod-like member 51 alone, in the same manner as described above in connection with the conductive polymer. In such a case, an extremely highly conductive contactor can be provided at a low cost. Note that the configuration in which a surface of Inconel is covered with a thin coating of gold is not necessarily limited to vertically aligned probe needles; it could also be applied to laterally aligned probe needles provided oriented diagonally downward from the probe card, such as those having bumps. It could also be applied to such bump portions alone.

In accordance with this first embodiment of the present invention, since the main body of the contactor through which the signal current flows is shielded by the insulating film, any generation of noise in the surroundings will not affect it, and mutual crosstalk between the signal currents is also prevented. Therefore, reliable measurement and testing is possible.

Further, since a second insulating film is provided over the outer periphery of the conductive layer, reliable measurement and testing is possible without any of the ill effects that would otherwise occur if one contactor should touch another of the contactors during the measurement and testing.

[Second Embodiment]

A method of coating a probe needle based on the present invention is described below with reference to the accompanying drawings, taking as an example the coating of an insulating film of a material such as parylene on a probe needle.

Figure 5:
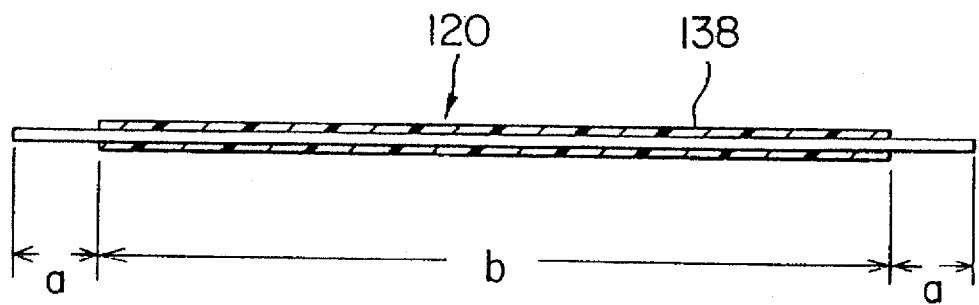
FIG. 5 is a schematic view of a probe needle on which an insulating coating is implemented by a coating method in accordance with a second embodiment of the present invention.

As shown in FIG. 5, a portion a of an extremely fine probe needle 120 does not need to be coated because it passes through holes in the guide plates 2 and 3, shown in FIG. 15A and FIG. 15B. Since the tip portion of the portion a is in contact with one of the measurement pads 8, it is necessary that it is always held in an electrically conductive state. Therefore, the two ends of the portions a do not need to be coated. However, a remaining portion b of the probe needle 120 is to be coated with a film to ensure that no short-circuits or scratch damage can occur if the probe needle should come into contact with other probe needles.

In the prior art, a Teflon agent is painted over the surface of the probe needle to implement the insulating coating, because it is simple to handle and does not create dust while the probe needle is being used. However, an insulating coating formed by painting is thick and is difficult to make uniform, and also defects such as pinholes are likely to occur.

The present inventors have already developed a coating method that uses vacuum deposition to form on an extremely fine probe needle a thin film of a thermoplastic resin, such as a poly-para-xylene insulating film, that has a uniform thickness, is free of pinholes, and moreover is capable of providing a lifetime of at least 100,000 uses. Since this insulating coating produced by vacuum deposition can form a uniform coating of a desired film thickness, without pinholes, on an extremely fine probe needle, which is particularly difficult to do in the prior art, it is a method that can be applied equally well to horizontally aligned tungsten wire probe needles as well as vertically aligned probe needles, and is extremely effective in tightening the pitch of such probe needles. In other words, by first forming an insulating coating of parylene by vacuum deposition, then making sure that adjacent probe needles cannot cause short-circuits, it becomes possible to promote even tighter pitches of the probe needles. This method of coating an insulating film by vacuum deposition can also be applied to mass production.

However, when it comes to implementing the above insulating coating by vacuum deposition, the accuracy of the technique used to coat the non-coating portions is essential. Thus, the present invention responds to this technical requirement by providing a method of coating a probe needle that does not damage the masked portions of the probe needle, can reliably and highly accurately form a masking boundary of the insulating film, can be applied to vacuum deposition, and moreover is suitable for mass production.

A coating method in accordance with a second embodiment of the present invention is described below with reference to the accompanying diagrams.

Figure 6:
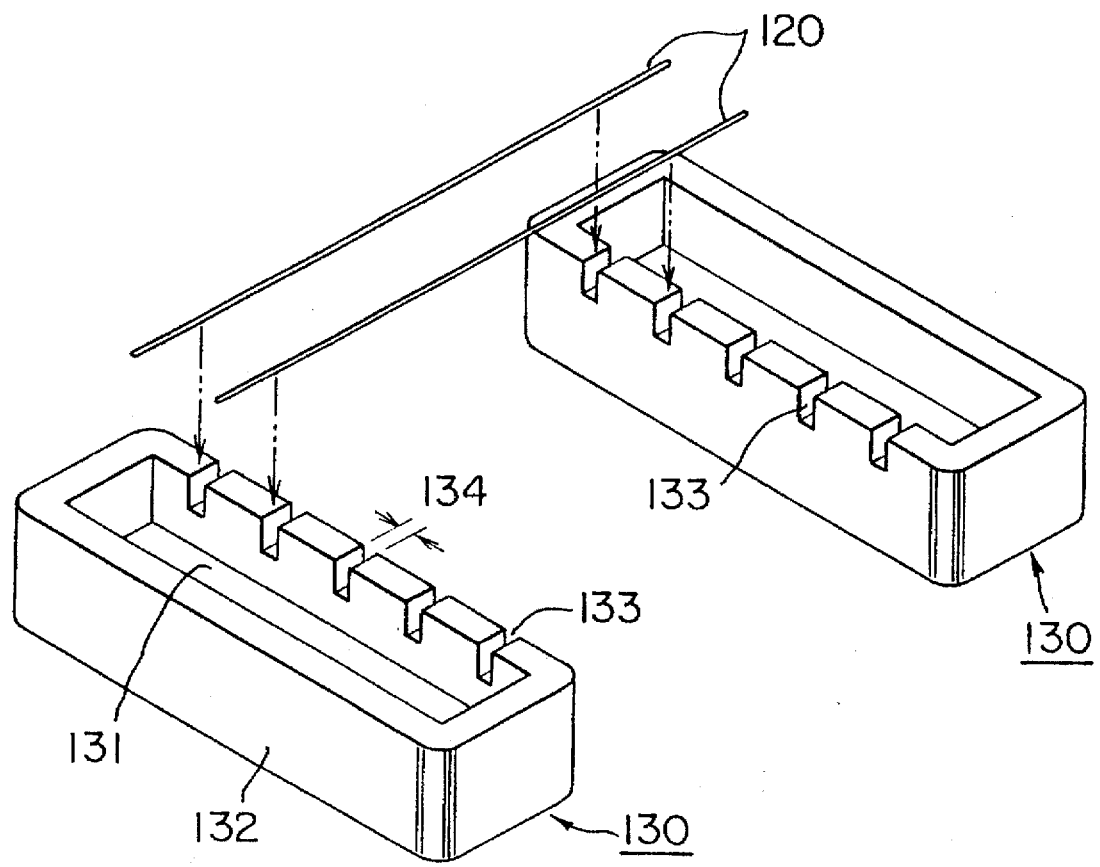
FIG. 6 is a view illustrative of the method of coating an insulating film over a probe needle in accordance with the second embodiment of the present invention

As shown in FIG. 6, one embodiment of the method of the present invention can be implemented by using a pair of tanks 130 for holding a melted thermally liquefiable wax used for masking. Each of these tanks 130 is configured of a substantially rectangular base portion 131 surrounded by a wall portion 132. A plurality of slits 133 are formed at an appropriate spacing in the wall portion 132. An opening width 134 of these slits 133 is somewhat wider than the outer diameter of the probe needles 120, such that the non-coating portions of the probe needles 120 can be inserted and positioned within the slits 133 as shown in FIG. 6. Note that the depth of insertion of the probe needles 120 is adjusted in consideration of the amount by which the surface tension of the melted thermally liquefiable wax will make it project, as will be described below.

After the probe needles 120 have been positioned in the slits 133 of the tanks 130, a thermally liquefiable wax 135 which is solid at room temperature but which has been melted by being heated to, for example, 70 degrees C., is poured into a wax collection portion formed by the base portion 131 and the wall portion 132 of each of the tanks 130, to fill it. This melted thermally liquefiable wax 135 is in a liquid phase so it flows around gaps 136 between the slits 133 and each probe needle 120 and ends up projecting somewhat out of the slits 133 due to the stickiness and surface tension of the wax, to form a so-called masking boundary 137.

Next, the masking process is completed by cooling the thermally liquefiable wax 135 in this state down to room temperature so that it solidifies. During this time, since the setting contraction ratio of the thermally liquefiable wax is small, not only is the non-coating portion a of the probe needle 120 not damaged, but also the masking boundary 137 can be adjusted with a high level of accuracy. Since there are no air bubbles in the thermally liquefiable wax 135, the non-coating portion a can be completely masked.

Note that in the above described embodiment, masking is performed by filling the tanks 130 with a thermally liquefiable wax 135 that has been heated and melted by an external heating means, but the present invention is not limited thereto. The configuration could be such that previously solidified wax is placed in the tanks 130 and then the thermally liquefiable wax in the tanks 130 is heated and melted by a suitable heating means installed in each of the tanks 130.

Figure 9:
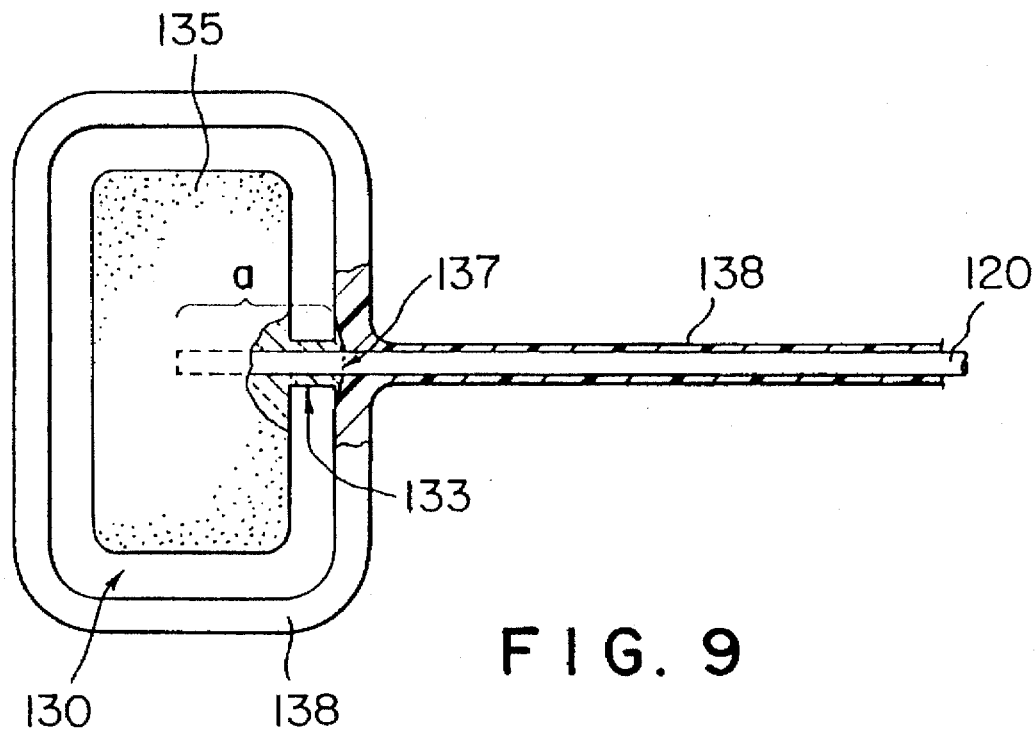
FIG. 9 is an enlarged cross-sectional view of the status of the method of coating an insulating film aver a probe needle shown in FIG. 6 after vacuum deposition processing is complete.

The tanks 130 and the probe needles 120 are then placed in a vacuum chamber 150 as shown in FIG. 8, and, after the pressure therein has been reduced to, for example, $10^{-8}$ Torr through a vacuum evacuation tube 152, a gas such as parylene gas is supplied through a gas supply tube 151 and a poly-para-xylene film 138 is formed by vacuum deposition. As a result, a pinhole-free coating of a poly-pare-xylene film 138 of a uniform thickness of, for example, 5 μm is formed over the entire surface of the slits 133 and the probe needles 120, as shown in FIG. 9. During this process, since the non-coating portions a of each probe needle 120 are completely and hermetically covered by the thermally liquefiable wax 135, there is no deposition of poly-para-xylene particles on these portions a.

Figure 10:
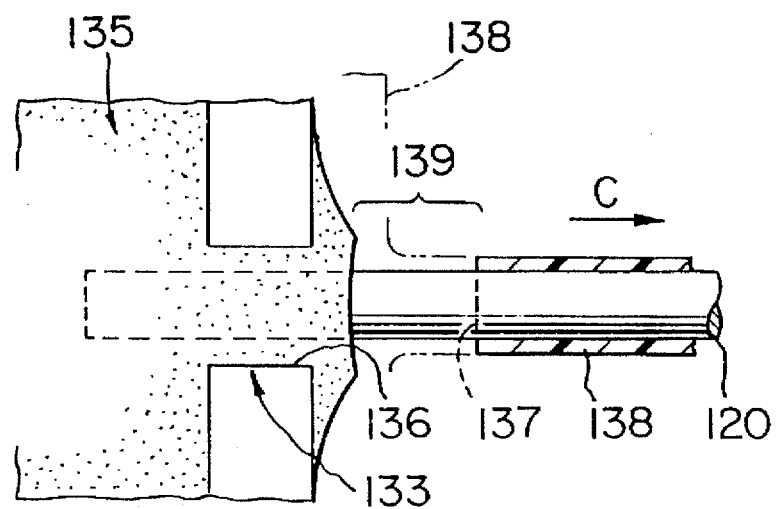
FIG. 10 is an enlarged plan view of the removal status of a probe needle during the implementation of the method of coating an insulating film over a probe needle shown in FIG. 6.

Since the poly-para-xylene deposition film 138 is firmly attached to the probe needle 120 and each tank 130, if the probe needle 120 is pulled out in the direction of the arrow C in FIG. 10 after the wax 135 covering the non-coating portions a of the probe needles 120 has been melted once again by being heated to, for example, 70 degree C. by a suitable heating means, a masking boundary 137 is formed around the circular periphery at a boundary portion 139 thereof, and thus the thin film is broken without creating any ragged film edges. As a result, the insulating coating portion b is delimited from each non-coating portion a by an accurate masking boundary 137, and thus a probe needle 120 with a completed insulating coating can be obtained. It is also possible to simply and completely remove any wax remaining at the non-coating portions a of the probe needles by subjecting the probe needles 120, with their completed insulating coatings, to washing in alcohol or by ultrasonics particularly in alcohol. Note that the wax used in this waxing process can be heated and melted again for re-use.

Figure 11A:
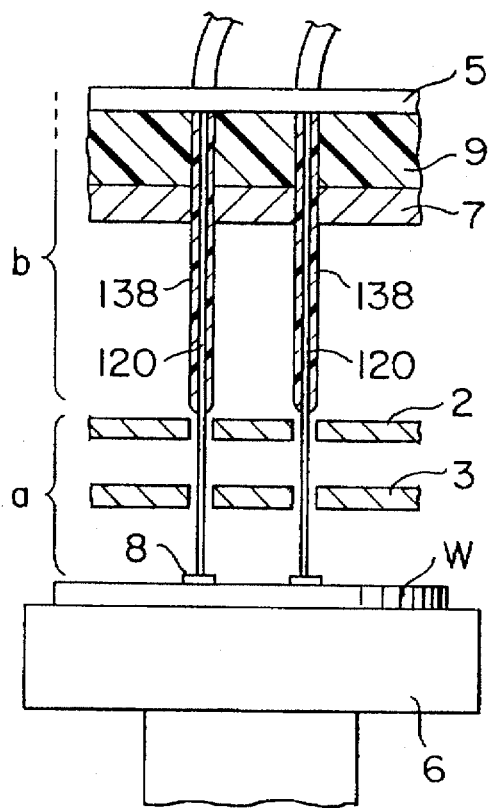
FIG. 11A and FIG. 11B are views illustrative of usage conditions of a probe needle implemented by the method of coating an insulating film shown in FIG. 6.
Figure 11B:
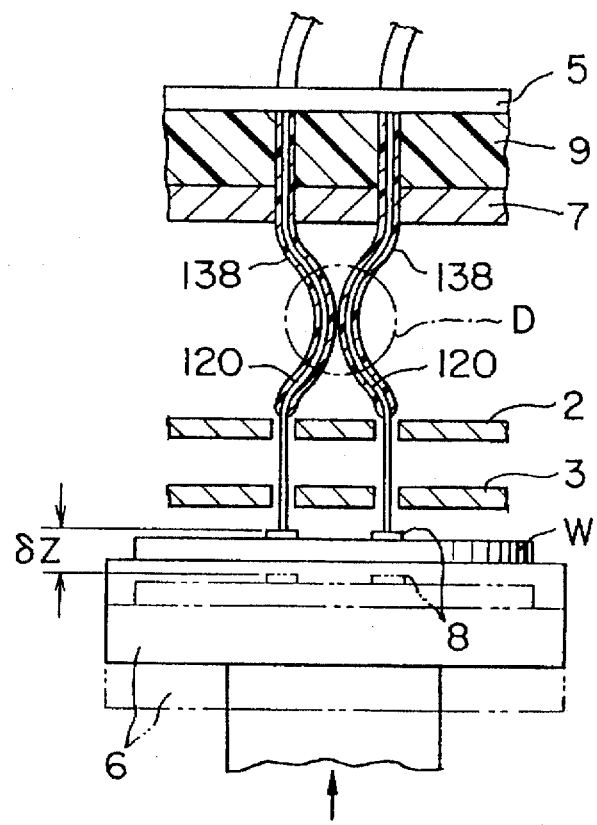

Probe needles 120 configured as described above can be mounted in a probe card in the same manner as prior art probe needles, as shown in FIG. 11A and FIG. 11B, and used for testing semiconductor chips. During this testing, as shown in FIG. 11B, each of the probe needles is protected by its deposition film 138 in accordance with the present invention, so that malfunctions such as short-circuits and damage can be completely avoided, even if the probe needles should bend during the measurement and adjacent probe needles come into contact with one another. Further, since a poly-para-xylene film formed by vacuum deposition is extremely durable, the number of times these probe needles are used can be greatly increased.

The above embodiment of the coating method of the present invention was described with reference to the implementation of an insulating coating on a probe needle, but it should be obvious to those skilled in the art that the present invention is not limited thereto.

It has recently become necessary to provide impedance adjustment at the tips of the probe needles, particularly when high-speed probe-testing is required. Therefore, the present invention also proposes a technique of covering each conductive probe needle with an insulating film, forming a conductive film for grounding of a metal or similar material over the insulating film, then coating another insulating film over the conductive film. In such a case, the present invention can also be applied not only to the masking required for the coating by vacuum deposition of the insulating films, but also to that of the conductive film.

The above embodiment was described with reference to an adaptation to an insulating coating for vertically aligned probe needles, but the present invention is not limited to such an embodiment. If the insulating coating based on the present invention is applied to horizontally aligned probe needles in particular, not only can inaccurate measurement caused by adjacent probe needles bending and touching during the measurement be prevented, in the same manner as with vertically aligned probe needles, but, since adjacent probe needles are protected by a protective film, fabrication and assembly is simple and product quality is stable.

In accordance with the method of coating a probe needle of the present invention, a probe needle with a insulating coating and non-coating portions that are clearly delimited by a highly accurate masking boundary with no ragged edges can be provided, without any damage to the probe needle. Further, the above method is particularly applicable to vacuum deposition and can be used to deposit thin, uniformly deposited films with no pinholes on large quantities of probe needles.

[Third Embodiment]

A probe card of a probe device that is a third embodiment of the present invention will now be described in detail with reference to the accompanying drawings.

Figure 12:
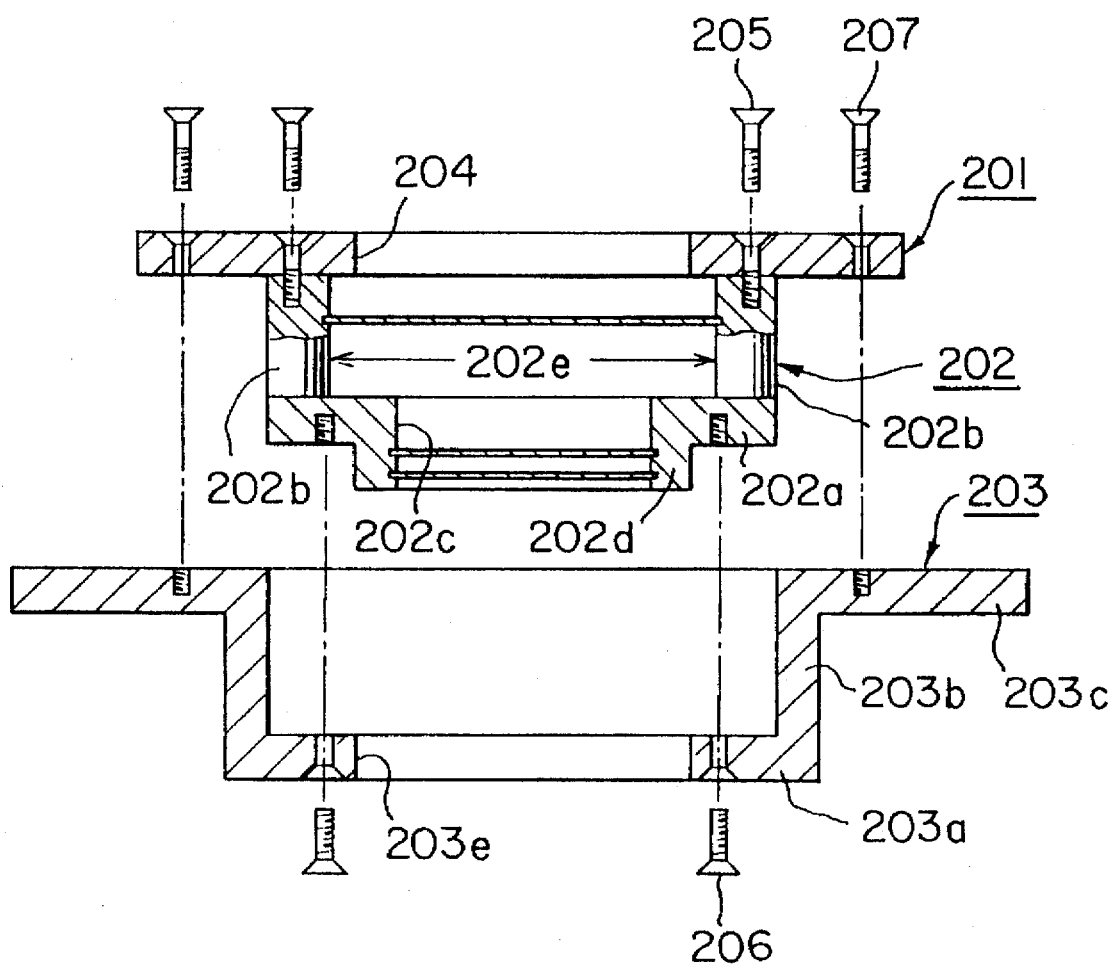
FIG. 12 is an exploded cross-sectional view of a guide portion of a probe card of a probe device of a third embodiment of the present invention.

A probe card configured on the basis of the present invention comprises a top plate 201, an inner guide portion 202 for guiding probe needles toward an object under test, and an outer guide portion 203 that covers the inner guide portion 202 from the outside, as shown in FIG. 12.

The top plate 201 could be configured of a printed circuit board or the like, or it could be configured to incorporate a printed circuit board for a probe card. The top plate 201 has a substantially table shape with an aperture 204 in a central portion thereof for vertically aligned probe needles 212, as shown in FIG. 13.

In the embodiment shown in FIG. 13, the inner guide portion 202 is configured of a substantially rectangular bottom plate portion 202a and four column members 202b that connect the bottom plate portion 202a to the top plate 201. An aperture 202c is provided piercing the approximate center of the bottom plate portion 202a, with the aperture 202c being surrounded by a wall 202d that protrudes downward from the bottom plate portion 202a. This wall 202d is provided in order to arrange upper and lower guide plates 217 and 218 that will be described below.

An internal chamber is formed in the open area surrounded by the four column members 202b of this structure, for providing the probe needles vertically, but since the columns are arranged at a certain spacing, the situation within that chamber can be monitored through a gap 202e therebetween, and also, if necessary, the inner space can be accessed from the outside.

An upper portion of the gap 202e formed between the four column members 202b is surrounded by a wall 202f. The space surrounded by this wall 202f is used to position a fixing resin member 214 and a needle fixing plate 215 for fixing the probe needles that are set up vertically within the internal chamber of the inner guide portion 202, as will be described below.

Note that in this third embodiment the inner guide portion 202 is configured of the bottom plate portion 202a and the column members 202b, but the present invention is not limited thereto. For example, substantially the same effects as those of the above embodiment can be obtained by a configuration wherein the inner guide portion 202 comprises a bottom plate portion with a wall portion surrounding an upper periphery of the bottom plate portion, a suitable aperture is provided in this wall portion, and access to an inner chamber surrounded by this wall portion can be obtained.

The outer guide portion 203 will now be described with reference once more to FIG. 12. The outer guide portion 203 is configured of a bottom plate portion 203a, a wall portion 203b surrounding an upper periphery of the bottom plate portion 203a, and a shield portion 203c fixed to the top plate 201 protruding from a periphery of an upper portion of the wall portion 203b.

An aperture 203e is provided piercing the approximate center of the bottom plate portion 203a. The dimensions of the aperture 203e are adjusted in such a manner that it mates with the wall 202d surrounding the aperture 202c of the inner guide portion 202. The wall portion 203b is configured so as to cover the column members 202b of the inner guide portion 202 and the entire gap 202e. This configuration can not only prevent the entry of a foreign body from the outside into the inner chamber within which the probe needles 212 are provided vertically through the gap 202e during use, but can also reinforce the entire structure by firmly supporting the inner guide portion 202 within the top plate 201.

The fabrication and assembly of the probe card of the probe device in accordance with the present invention will now be described with reference to FIG. 14. When the probe card of the present invention is assembled, the internal chamber for setting up the probe needles is first formed by fixing together the top plate 201 and the inner guide portion 205 by a first fixing means that can easily be disassembled, such as screws 205. This internal chamber, as mentioned before, is provided with a needle fixing plate 215, an upper guide plate 217, and a lower guide plate 218, through each of which is pierced a plurality of holes for the probe needles 212 to pass therethrough. Probe needles 212 constructed of a conductive body of a material such as gold or tungsten are then set up vertically in such a manner that they pass each of through these holes. After the necessary number of probe needles 212 has been positioned in the inner guide portion 202, the needle-fixing resin member 214 is poured into the internal chamber to fix the needles.

In the current state of the art, it is inevitable that the positioning of the probe needles 212 must be done manually while it is being observed through a microscope. Moreover, if several thousand needles are to be set up within a space of only a few square centimeters, failures cannot be permitted, even if some of the needles should be defective, because the probe needles 212 cannot be accessed from above, so the work of setting up the probe needles 212 demands extremely high levels of skill and concentration. However, in accordance with the present invention, not only can the internal chamber wherein the probe needles are set up be observed from the side, but the internal chamber can be accessed from the outside if necessary, so that the burden required in the work of setting up the probe needles is greatly reduced.

Next, in accordance with the present invention, the setting up of the probe needles as described above is completed and the outer guide portion 203 is fixed with respect to the inner guide portion 202. This fixing attaches the upper surface of the bottom plate portion 203a of the outer guide portion 203 to the lower surface of the bottom plate portion 202a of the inner guide portion 202 by a second fixing means that can easily be disassembled, such as screws 206. The inner and outer guide portions 202 and 203 are then fixed with respect to the top plate 201 by fixing the upper surface of the shield portion 203c of the outer guide portion 203 to the lower surface of the top plate 201 by a third fixing means that can easily be disassembled, such as screws 207.

Further, in accordance with the present invention, the relative positions of the top plate 201, inner guide portion 202, and outer guide portion 203 can each be adjusted, by adjusting the first, second, and third fixing means 205, 206, and 207.

In accordance with the present invention, the inner guide portion 202 and outer guide portion 203 are fixed together by a fixing means that can easily be disassembled. Therefore, if part of the probe card should become defective after assembly, the outer guide portion 203 can be easily removed, and the defective portions can easily be accessed from the gap 202e between the column members 202b of the inner guide portion 202, thus facilitating maintenance. After such maintenance is completed, the outer guide portion 203 is once again attached to the inner guide portion 202 by the fixing means.

Note that, although the above description concerns an example of a configuration based on the present invention that is applied to a probe card provided with vertically aligned probe needles, the present invention is not limited to such an embodiment. The present invention could naturally be applied to a horizontal type of probe card where the probe needles are arranged substantially horizontally with respect to the probe card.

As described above, in accordance with a probe device based on the present invention, a guide means for the probe needles is configured from structural members that can be disassembled, and, since it is simple to monitor and access the probe needles from the outside, particularly because the inner guide means has a frame-like construction, not only is it easy to assemble the probe device, operation and maintenance are facilitated after assembly.

Further, in accordance with the probe device based on the present invention, the inner guide means, outer guide means, and top plate can be easily fixed and removed by simple fixing means such as screws. By adjusting these fixing means, it is possible to finely adjust the planarity of the tips of the probe needles in a simple manner, even after the probe device has been assembled.

What is claimed is:

1. A method of coating a probe needle comprising the steps of:
    covering a portion of said probe needle with a melted thermally liquefiable wax to form a masked portion by positioning the portion of said probe needle within a tank such that melted thermally liquefiable wax within said tank comes in contact with said portion;
    hardening at room temperature said thermally liquefiable wax that covers said masked portion;
    implementing a coating of poly-para-xylene by vacuum deposition over said probe needle provided in said tank while said probe needle and said tank are in a vacuum chamber under a vacuum condition;
    heating said thermally liquefiable wax following the vacuum deposition of the poly-para-xylene to place said thermally liquefiable wax in a molten state; and
    removing said probe needle from the heated molten wax by pulling out said probe needle in an axial direction thereof.

2. The method of coating a probe needle of claim 1, further comprising a step of, after said probe needle has been removed from the molten wax, washing said probe needle in alcohol to remove any remaining wax.

3. The method of coating a probe needle of claim 1, wherein, when said masked portion is being covered with said melted thermally liquefiable wax, a waxing boundary is formed between said masked portion and a coating portion to which poly-para-xylene is to be vacuum deposited by the stickiness and surface tension inherent to said wax.

4. A method of coating a probe needle comprising:
    forming a tank and probe needle combination by
        (i) positioning a to-be-masked portion of the probe needle so as to come into contact with liquified wax contained in the tank, and
        (ii) allowing the liquified wax to harden about the portion of the probe needle so as to form a masked probe needle portion;
    vacuum depositing poly-para-xylene over said tank and probe needle of said tank and probe needle combination so as to coat the probe needle and tank; and
    separating said probe needle from the wax contained in said tank following the vacuum depositing of poly-para-xylene.

5. The method of claim 4, wherein forming the tank and probe needle combination includes placing an end of the probe needle, which represents the to-be-masked portion of said probe needle, into a slot formed in said tank, which slot is sized such that the liquified wax extends out of the tank along said probe needle to form a projection of hardened wax, external to said tank, about said probe needle upon wax hardening.

6. The method of claim 4, wherein the wax is hardened at room temperature.

7. The method of claim 6, wherein separating said probe needle from the tank includes heating the hardened wax contained in the tank.

8. The method of claim 5, wherein separating said probe needle from the tank includes pulling the probe needle, along an axial direction of the probe needle, out of the slot.

9. The method of claim 7, wherein, following separation of the probe needle from the tank, said end of the probe needle is washed in a solvent to remove any wax remaining thereon.

10. The method of claim 4, wherein, following the wax hardening and prior to the vacuum depositing step, the tank and probe needle combination is positioned within a vacuum depositing chamber wherein the vacuum depositing step is carried out.

11. A method of coating a probe needle, comprising:
    placing a first end of the probe needle in a slot formed in a first tank such that the first end extends into said first tank;
    placing a second end of the probe needle in a slot formed in a second tank such that the second end extends into the second tank, and an intermediate portion extends between said first and second tanks;
    covering said first end with liquified wax contained in said first tank;
    covering said second end with liquified wax contained in said second tank;

allowing the wax in said first tank and the wax in said second tank to harden about the respective first and second ends of said probe needle;

positioning said first and second tanks with hardened wax covering the ends of said probe needle within a vacuum depositing chamber;

vacuum depositing poly-para-xylene over said tanks and probe needle so as to coat the intermediate portion of said probe needle and tanks; and separating said probe needle from the wax contained in said tanks following the vacuum depositing step.

12. The method of claim 11, wherein the wax is hardened at room temperature.

13. The method of claim 11, wherein separating said probe needle from the tanks includes heating the hardened wax contained in the tanks.

14. The method of claim 11, wherein separating said probe needle from the tanks includes pulling the probe needle, along an axial direction of the probe needle, out of the slots.

* * * * *